US008659958B2

(12) United States Patent
Wang (10) Patent No.: US 8,659,958 B2
(45) Date of Patent: Feb. 25, 2014

(54) MEMORY DEVICE AND RELATED CONTROL METHOD

(75) Inventor: Chia-Wei Wang, Taichung (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 415 days.

(21) Appl. No.: 13/166,773

(22) Filed: Jun. 22, 2011

(65) Prior Publication Data
US 2012/0327727 A1 Dec. 27, 2012

(51) Int. Cl.
*G11C 7/00* (2006.01)

(52) U.S. Cl.
USPC .................................. 365/189.16; 365/185.2

(58) Field of Classification Search
USPC .......................................... 365/189.16, 185.2
See application file for complete search history.

(56) References Cited

U.S. PATENT DOCUMENTS

| 6,690,608 B2* | 2/2004 | Nii et al. ..................... 365/210.1 |
| 7,355,915 B2* | 4/2008 | Gouin et al. ................ 365/210.1 |
| 2011/0222340 A1* | 9/2011 | Lee et al. .................... 365/185.2 |
| 2013/0070529 A1* | 3/2013 | Park ........................... 365/185.11 |
| 2013/0188426 A1* | 7/2013 | Park et al. ................. 365/185.22 |

OTHER PUBLICATIONS

Hyunwoo Nho, High-Performance Embedded Memory, "A 32nm High-k Metal Gate SRAM with Adaptive Dynamic Stability Enhancement for Low-Voltage Operation", Feb. 2, 2010, 346-347, figure 19.3.7, Session 19.3, ISSCC 2010.
Yuki Fujimura, High-Performance Embedded Memory, "A Configurable SRAM with Constant-Negative-Level Write Buffer for Low-Voltage Operation with 0.149um2 Cell in 32nm High-k Metal-Gate CMOS", Feb. 10, 2010, 348-349, figure 19.4.7, Session 19.4, ISSCC 2010.

* cited by examiner

*Primary Examiner* — Tuan T. Nguyen
(74) *Attorney, Agent, or Firm* — Winston Hsu; Scott Margo (57) ABSTRACT

A memory device includes: a first memory cell at least controlled by a first word line; a first auxiliary circuit coupled to an auxiliary bit line and controlled by the first word line, the first auxiliary circuit capable of storing a predetermined data value; and a control circuit capable of controlling a first word line voltage of the first word line according to a bit line voltage of the auxiliary bit line.

20 Claims, 7 Drawing Sheets

MEMORY DEVICE AND RELATED CONTROL METHOD

BACKGROUND

The present invention relates to a memory device and related control method, and more particularly to a memory device with reduced half-select-disturbance, and a related method.

In a memory such as a static random access memory, a logic value can be written in or read out from a memory cell of the memory. When a logic value is written to the memory cell, the voltage level of the word line coupled to the memory cell is charged to a high voltage level to turn on the pass transistors of the memory cell. Then, if the bit value being written is logic 1, the voltage level of a first bit line coupled to the memory cell is charged to the high voltage level and the voltage level of a second bit line coupled to the memory cell is discharged to a low voltage level; if the bit value being written is logic 0, the voltage level of the first bit line is discharged to the low voltage level and the voltage level of the second bit line is charged to the high voltage level. Accordingly, the logic value is written into the memory cell of the memory by complementing the voltage levels of the first bit line and the second bit line coupled to the memory cell. However, when the voltage level of the word line coupled to the memory cell is charged to the high voltage level, all of the pass transistors of the other memory cells coupled to the word line are also turned on, and the memory cells that are coupled to the word line but not coupled to the first bit line and the second bit line may suffer from a disturb phenomenon. Therefore, the logic values stored in the other memory cells could be changed, which is called the half-select-disturb phenomenon. To reduce this half-select-disturb phenomenon, the pass transistors need to be sized down. However, to improve write margin and write-in speed, the pass transistors need to be sized up. In other words, there is a trade-off when choosing the sizes of the pass transistors of the conventional memory cell. How to improve the stability and the accessing speed of the static random access memory cell is becoming a critical problem in this field.

SUMMARY

One of the objectives of the present invention is to provide a memory device with reduced half-select-disturbance, and a related method.

According to a first embodiment of the present invention, a memory device is provided. The memory device comprises a first memory cell, a first auxiliary circuit, and a control circuit. The first memory cell is at least controlled by a first word line. The first auxiliary circuit is coupled to an auxiliary bit line and controlled by the first word line, wherein the first auxiliary circuit is capable of storing a predetermined data value. The control circuit is capable of controlling a first word line voltage of the first word line according to a bit line voltage of the auxiliary bit line.

According to a second embodiment of the present invention, a method of controlling a memory device is disclosed, wherein the memory device comprises a first memory cell at least controlled by a first word line. The method comprises: providing a first auxiliary circuit capable of storing a predetermined data value, wherein the first auxiliary circuit is controlled by the first word line; coupling the first auxiliary circuit to an auxiliary bit line; and controlling a first word line voltage of the first word line according to a bit line voltage of the auxiliary bit line.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
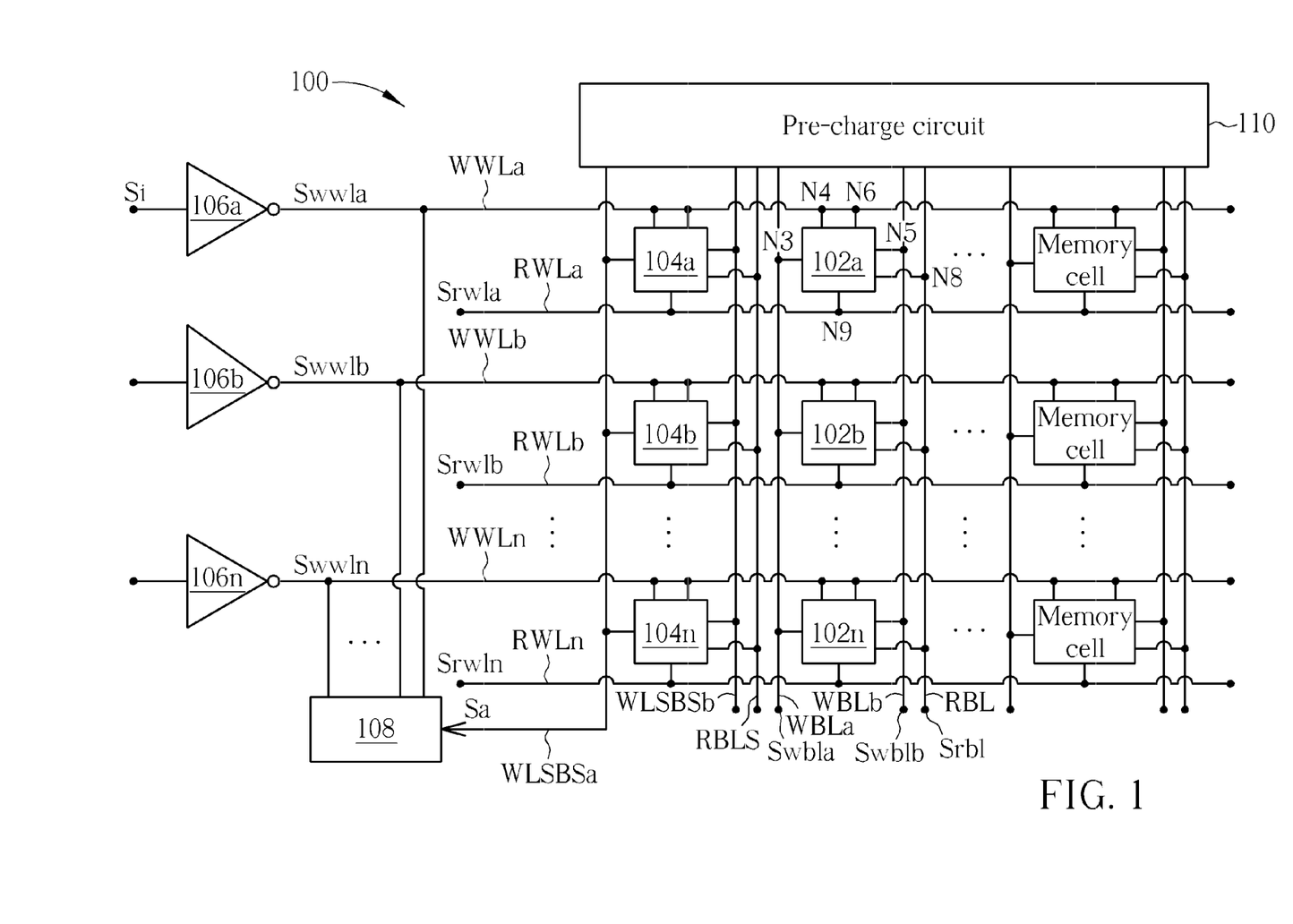
FIG. 1 is a diagram illustrating a memory device according to a first embodiment of the present invention.

Please refer to FIG. 1. FIG. 1 is a diagram illustrating a memory device 100 according to a first embodiment of the present invention. The memory device 100 can include a plurality of memory cells 102a, . . . , 102n, a plurality of auxiliary circuits 104a, . . . , 104n, a plurality of inverters 106a, . . . , 106n, a control circuit 108 and a pre-charge circuit 110. The write-in selections of the memory cells 102a, . . . , 102n can be controlled by a plurality of write word lines respectively, i.e., WWLa, . . . , WWLn, and the read-out selections of the memory cells 102a, . . . , 102n can be controlled by a plurality of read word lines respectively, i.e., RWLa, . . . , RWLn. The auxiliary circuits 104a, . . . , 104n can be implemented as the dummy circuits of the memory cells 102a, . . . , 102n respectively, in which each of the auxiliary circuits 104a, . . . , 104n is capable of storing a predetermined data value. In this embodiment, the predetermined data value is logic zero. However, it should be understood that the predetermined data value can be any other values according to different design requirements. Furthermore, the auxiliary circuits 104a, . . . , 104n can also be controlled by the word lines WWLa, . . . , WWLn respectively, and the auxiliary circuits 104a, . . . , 104n can be coupled to a same auxiliary write bit line WLSBSa, wherein the auxiliary write bit line WLSBSa is utilized for generating an auxiliary bit line voltage Sa when one of the auxiliary circuits 104a, ..., 104n is selected by the corresponding word line.

It should be noted that, as the memory cells 102a, ..., 102n belong to the same column, the memory cells 102a, ..., 102n are coupled to the same first write bit line WBLa, the same second write bit line WBLb, and the same read bit line RBL, wherein the first write bit line WBLa and the second write bit line WBLb are utilized for writing, for example, a logic one or zero into the memory cell selected by the write word line, and the read bit line RBL is utilized for reading out the logic value stored in the memory cell selected by the read word line. In addition, in practice, there can be a plurality of columns of memory cells in the memory device 100, but only one column of memory cells is numbered in FIG. 1 for brevity.

Each of the inverters 106a, ..., 106n has an input terminal and an output terminal coupled to each of the write word lines WWLa, ..., WWLn, respectively. When the input terminal of one inverter receives an input signal Si, the inverter generates a word line voltage at the corresponding write word line. The control circuit 108 is capable of controlling the word line voltage of one of the write word lines WWLa, ..., WWLn according to the auxiliary bit line voltage Sa of the auxiliary write bit line WLSBSa, wherein the bit line voltage Sa derives from the predetermined data value (e.g., logic zero) stored in the auxiliary circuit selected by the word line voltage. More specifically, when one auxiliary circuit is selected by the word line voltage, the predetermined data value (e.g., logic zero) stored in the selected auxiliary circuit can make the selected auxiliary circuit discharge the auxiliary bit line voltage Sa of the auxiliary write bit line WLSBSa. Then, the control circuit 108 is capable of controlling the word line voltage of the selected write word line according to the auxiliary bit line voltage Sa.

In addition, the memory device 100 may further include a pre-charge circuit 110 capable of pre-charging the voltage levels of the first write bit line WBLa, the second write bit line WBLb, the read bit line RBL, and the auxiliary write bit line WLSBSa to a high voltage level before the input signal is inputted to the input terminal of one of the inverters 106a, ..., 106n.

Figure 2:
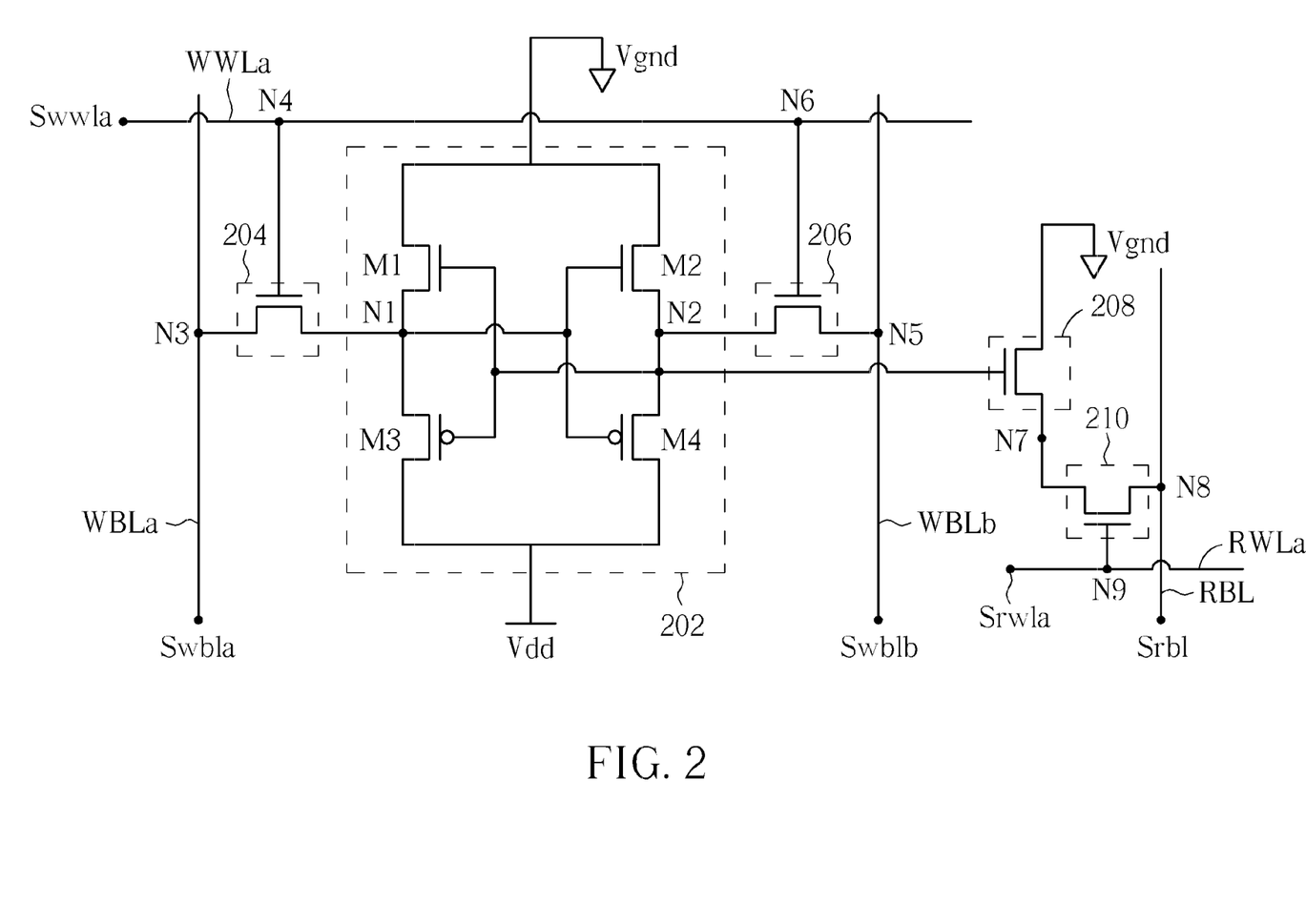
FIG. 2 is a diagram illustrating a memory cell according to an embodiment of the present invention.

In this embodiment, each of the memory cells 102a, ..., 102n is an 8-T static random access memory cell since the memory cell includes eight transistors as shown in FIG. 2. It should be noted that the present invention is not limited to the 8-T static random access memory cell; 6-T static random access memory cell or others can also be applied in another embodiment of the present invention. For brevity, FIG. 2 is a diagram illustrating one of the memory cells 102a, ..., 102n (e.g., the memory cell 102a) according to an embodiment of the present invention. The memory cell includes a latch circuit 202, a first transistor 204, a second transistor 206, a third transistor 208, and a fourth transistor 210. The latch circuit 202 is capable of storing a data bit (e.g., logic 1 or logic 0). In this embodiment, the latch circuit 202 includes four transistors M1-M4, wherein the transistors M1, M3 are configured as a first inverter, the transistors M2, M4 are configured as a second inverter, and the first inverter and the second inverter are capable of having a positive feedback loop, i.e., a latch. More specifically, the output terminal N1 (i.e., a first access terminal of the latch circuit 202) of the first inverter is coupled to an input terminal of the second inverter, and the output terminal N2 (i.e., a second access terminal of the latch circuit) of the second inverter is coupled to an input terminal of the first inverter. Furthermore, the latch circuit 202 can operate between a supply voltage Vdd and a ground voltage Vgnd.

The first transistor 204 has a first terminal (i.e., a bit transferring terminal of the first transistor 204) coupled to the output terminal N1 of the latch circuit 202, a second terminal N3 (i.e., the other bit transferring terminal of the first transistor 204) coupled to, for example, the first write bit line WBLa for receiving a first write bit line signal Swbla, and a control terminal N4 coupled to the write word line, for example, WWLa for receiving a write word line control signal Swwla. The second transistor 206 has a first terminal (i.e., a bit transferring terminal of the second transistor 206) coupled to the output terminal N2 of the latch circuit 202, a second terminal N5 (i.e., the other bit transferring terminal of the second transistor 206) coupled to, for example, a second write bit line WBLb for receiving a second write bit line signal Swblb, and a control terminal N6 coupled to the write word line WWLa. The third transistor 208 has a first terminal coupled to a voltage such as ground voltage Vgnd, a control terminal coupled to the output terminal N2 of the latch circuit 202, and a second terminal N7. The fourth transistor 210 has a first terminal coupled to the second terminal N7 of the third transistor 208, a second terminal N8 coupled to, for example, the read bit line RBL for outputting a read bit line signal Srbl, and a control terminal N9 coupled to, for example, the read word line RWLa for receiving a read word line control signal Srwla. It should be noted that the write word line control signal Swwla and the read word line control signal Srwla are row based signals, and the first write bit line signal Swbla, the second write bit line signal Swblb, and the read bit line signal Srbl are column based signals.

It should also be noted that the purpose of employing the auxiliary circuits 104a, ..., 104n in the memory device 100 is to monitor the changing voltage of the bit line (e.g., the first write bit line WBLa) from one voltage level (e.g., Vdd) to another voltage level (e.g., Vgnd) of the memory cell that stored the logic zero. Therefore, each of the auxiliary circuits 104a, ..., 104n can be implemented in the same way as the real memory cell (i.e., the memory cells 102a, ..., 102n) except they store logic zero. In other words, the configuration of each of the auxiliary circuits 104a, ..., 104n can be the same as the configuration of the memory cell shown in FIG. 2. Therefore, the auxiliary circuits 104a, ..., 104n can be further coupled to another auxiliary write bit line WLSBSb and an auxiliary read bit line RBLS, in which the auxiliary write bit line WLSBSb and the auxiliary read bit line RBLS have similar functions as the functions of the second write bit line WBLb and the read bit line RBL respectively. However, the present invention is not limited to this implementation. Any other circuits that are capable of monitoring the voltage variation of the bit line from tone voltage level to another voltage level of the real memory cell belong to the scope of the present invention.

According to the present invention, when one memory cell in the memory device 100, such as the first memory cell 102a, is selected for writing a value (e.g., 0 or 1) into the selected memory cell, the voltage level of the write word line controlling the row of memory cells including the selected memory cell, such as WWLa, can be charged from a low voltage level to a high voltage level. Here writing a value into the first memory cell 102a is taken as an example. Before a low voltage level of the input signal Si is inputted to the input terminal of the inverter 106a, the pre-charge circuit 110 can pre-charge the voltage levels of the first write bit line WBLa, the second write bit line WBLb, and the auxiliary write bit lines WLSBSa, WLSBSb to a high voltage level. Then, when the low voltage level of the input signal Si is inputted to the input terminal of the inverter 106a, the voltage level of the first write word line WWLa is increased gradually to turn on the pass transistors (i.e., the corresponding transistors having the same function as the first transistor 204 and the second transistor 206 in FIG. 2) in the first row of memory cells, which includes the first auxiliary circuit 104a and the first memory cell 102a.

Then, as the logic zero is stored in the first auxiliary circuit 104a, the high voltage level of the auxiliary write bit line WLSBSa will be gradually discharged to reach the low voltage level when the pass transistor (i.e., the corresponding transistor having the same function as the first transistor 204 in FIG. 2) in the first auxiliary circuit 104a is turned on. Meanwhile, the control circuit 108 will slow down the rising of the voltage level at the first write word line WWLa before the voltage level of the auxiliary write bit line WLSBSa is discharged to reach a low enough voltage. When the voltage level of the auxiliary write bit line WLSBSa is discharged to reach the low enough voltage, the control circuit 108 stops to slow down the rising of the voltage level at the first write word line WWLa and lets the first inverter 106a charge the voltage level to reach the predetermined top voltage level. Therefore, by slowing down the rising of the voltage level at the first write word line WWLa before the voltage level of the auxiliary write bit line WLSBSa reaches the low enough voltage, the logic zero stored in the memory cells coupled to the first write word line WWLa will be guaranteed to not change into logic one when the voltage level of the first write word line WWLa reaches the predetermined top voltage. This is because the first auxiliary circuit 104a is the dummy circuit of the real memory cell, and the discharging rate of the auxiliary write bit line WLSBSa will substantially equal the discharging rate of the write bit line of the other memory cell stored the logic zero. In other words, the present invention has reduced the half-select-disturb phenomenon in the memory device 100.

Figure 3:
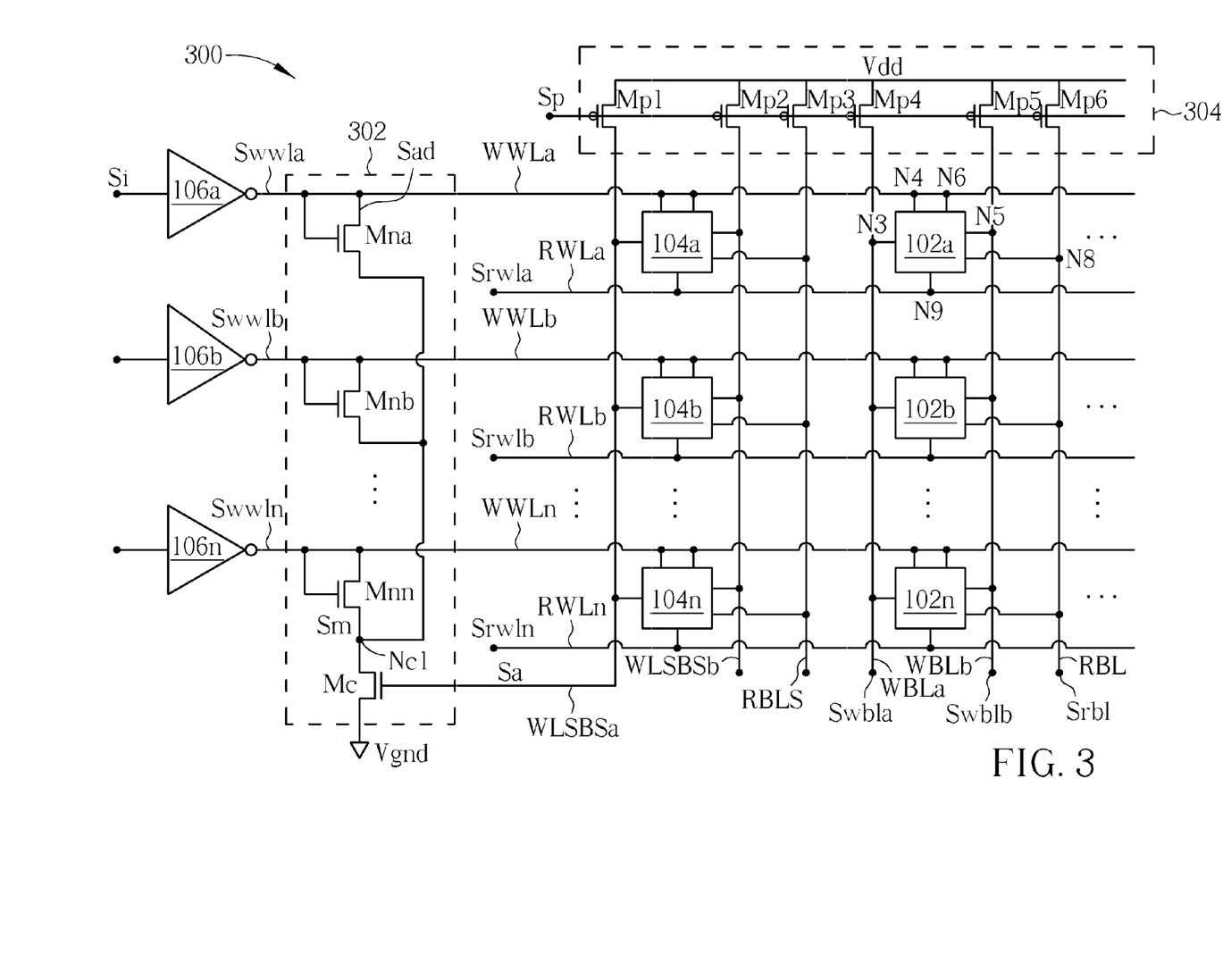
FIG. 3 is a diagram illustrating a memory device according to a second embodiment of the present invention.

Please refer to FIG. 3. FIG. 3 is a diagram illustrating a memory device 300 according to a second embodiment of the present invention. In this embodiment, the detailed circuit of the control circuit and the pre-charge circuit are shown. For brevity, the components in the memory device 300 are labeled with the same numerals as those in the memory device 100 except for the control circuit and the pre-charge circuit. In this embodiment, the control circuit and the pre-charge circuit are labeled as 302 and 304 respectively. The pre-charge circuit 302 can include a plurality of transistors Mp1, . . . , Mp6, such as P-type field-effect transistors. Each of the transistors Mp1, . . . , Mp6 has a control terminal coupled to a pre-charge control signal Sp, a first terminal coupled to a voltage such as the supply voltage Vdd, and a second terminal coupled to each of the bit lines of the memory device 300 respectively (e.g., the auxiliary write bit lines WLSBSa, WLSBSb, the auxiliary read bit line RBLS, the first write bit line WBLa, the second write bit line WBLb, and the read bit line RBL). Before the write word line is selected by the input signal, the pre-charge control signal Sp goes to, for example, the low voltage level to turn on the transistors Mp1, . . . , Mp6 for pre-charging the voltage levels of the bit lines such as the auxiliary write bit lines WLSBSa, WLSBSb, the auxiliary read bit line RBLS, the first write bit line WBLa, the second write bit line WBLb, and the read bit line RBL to the high voltage level.

The control circuit 302 is a tracking circuit capable of tracking a variation of the auxiliary bit line voltage Sa of the auxiliary write bit line WLSBSa to generate an adjusting signal S ad to control the word line voltage of one of the write word lines WWLa, . . . , WWLn. The control circuit 302 may include a common transistor Mc, such as an N-type field-effect transistor, and a plurality of transistors Mna, . . . , Mnn, such as N-type field-effect transistors, wherein the common transistor Mc has a control terminal coupled to the auxiliary write bit line WLSBSa, a first connection terminal Nc1, and a second connection terminal coupled to a voltage such as the ground voltage Vgnd. Each of the transistors Mna, . . . , Mnn has a control terminal coupled to each of the write word lines WWLa, . . . , WWLn respectively, a first connection terminal coupled to the first connection terminal Nc1 of the common transistor Mc, and a second connection terminal coupled to each of the write word lines WWLa, . . . , WWLn respectively.

According to the present invention, when the memory device 300 is under the write-in process, one of the write word lines WWLa, . . . , WWLn will be selected. The common transistor Mc is used to monitor the variation of the auxiliary bit line voltage Sa of the auxiliary write bit line WLSBSa to generate a monitoring signal Sm to one of the transistors Mna, . . . , Mnn that is coupled to the selected write word line, wherein the selected transistor generates the adjusting signal Sad to the selected write word line. The transistors Mna, . . . , Mnn are diode-connected transistors. To more clearly describe the operation of the control circuit 302, writing a value into the first memory cell 102a is taken as an example.

Figure 4:
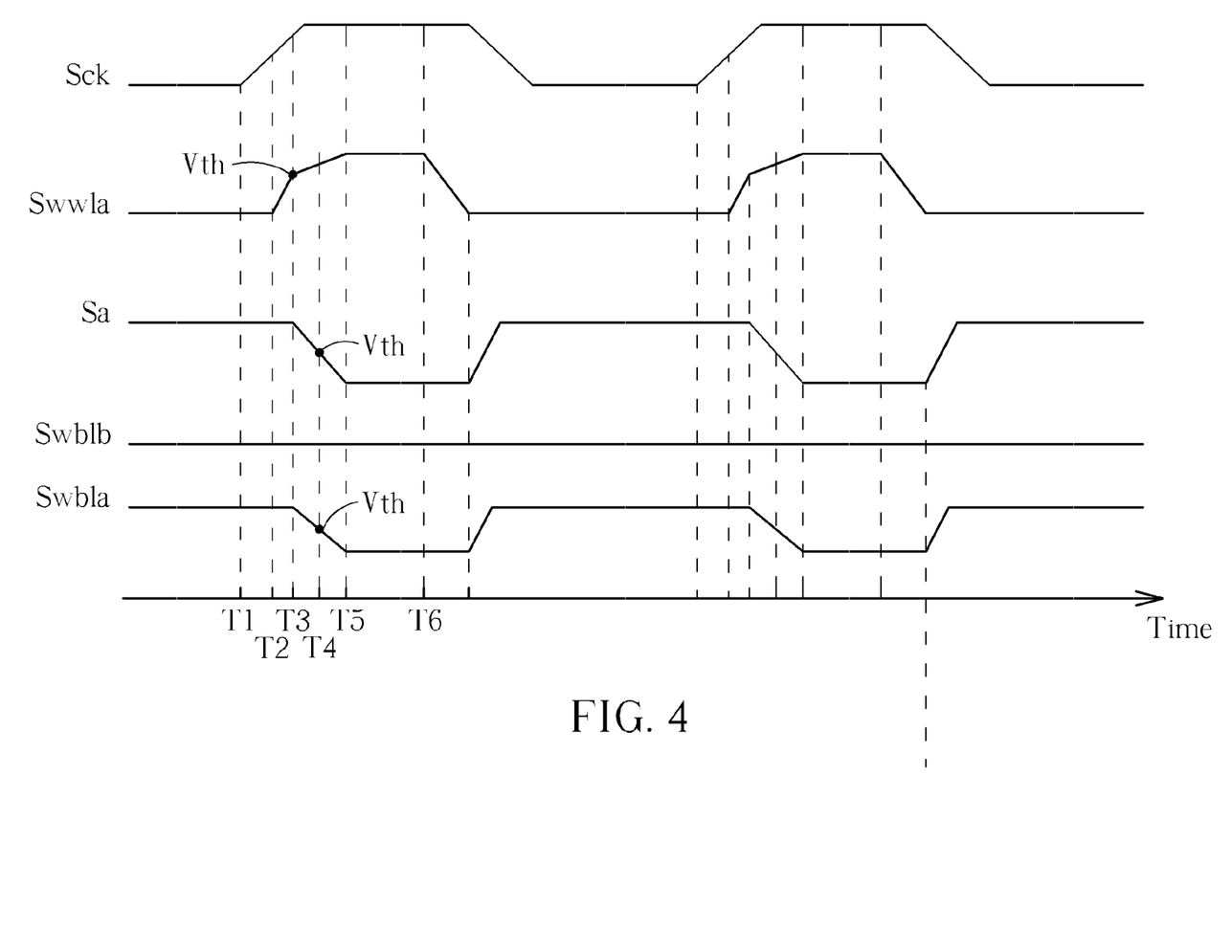
FIG. 4 is a timing diagram illustrating an operating clock signal, a first write word line control signal, an auxiliary bit line voltage, and a first write bit line signal and a second write bit line signal of a memory cell coupled to a first write word line and storing a logic zero of a memory device.

FIG. 4 is a timing diagram illustrating an operating clock signal Sck, the first write word line control signal Swwla, the auxiliary bit line voltage Sa, and a first write bit line signal Swbla and a second write bit line signal Swblb of a memory cell coupled to the first write word line WWLa and storing logic zero of the memory device 300. At time T1, the memory device 300 enters the write-in process of the first memory cell 102a. At time T2, the first write word line WWLa begins to charge from a low voltage level to a high voltage level. In the time interval between time T2 and T3, the diode-connected transistor Mna is still turned off since the first write word line control signal Swwla is lower than the threshold voltage Vth of the transistor Mna. Meanwhile, in the time interval between time T2 and T3, the auxiliary bit line voltage Sa remains at the high voltage level since the pass transistors (i.e., the corresponding transistors having the same function as the first transistor 204 and the second transistor 206 in FIG. 2) in the first auxiliary circuit 104a are still turned off. Then, after the time T3, the diode-connected transistor Mna and the pass transistors in the first auxiliary circuit 104a are turned on. Therefore, a current flows through the current path consisting of the diode-connected transistor Mna and the common transistor Mc to slow down the rising rate of the first write word line control signal Swwla as shown in FIG. 4. It should be noted that the voltage level of the auxiliary bit line voltage Sa is decreased gradually since the pass transistors in the first auxiliary circuit 104a are turned on to discharge the auxiliary bit line voltage Sa after time T3. Then, in the time interval between time T3 and T4, the first write word line control signal Swwla rises gradually with the rising rate slower than the rising rate between time T2 and time T3.

The common transistor Mc is turned off at the time T4 when the auxiliary bit line voltage Sa decreases to reach the threshold voltage Vth of the common transistor Mc. When the common transistor Mc is turned off, the current path consisting of the diode-connected transistor Mna and the common transistor Mc is opened, and therefore no more current will flow through the current path to the ground voltage Vgnd between time T4 and T5. The first write word line control signal Swwla reaches the predetermined top voltage level at time T5. It should be noted that the top voltage level can be the supply voltage Vdd or any other voltage level higher or lower than the supply voltage Vdd. In the time interval between time T5 and T6, the value is controlled to write into the first memory cell 102*a*.

Please refer to FIG. 4 again. Since the first auxiliary circuit 104*a* is the dummy circuit of the real memory cells, the falling rate of the auxiliary bit line voltage Sa is substantially equal to the falling rate of the first write bit line signal Swbla of the memory cell storing the logic zero and coupled to the first write word line WWLa. The auxiliary bit line voltage Sa is then utilized by the control circuit 302 for generating the adjusting signal Sad to adjust the first write word line control signal Swwla of the first write word line WWLa. Therefore, by using the first auxiliary circuit 104*a* and the control circuit 302, the rising rate of the first write word line control signal Swwla is slowed down after the time T3. In other words, it prolongs the time the first write word line control signal Swwla takes to reach the top voltage level and thus provides enough time for the memory cell storing the logic zero and coupled to the first write word line WWLa to discharge its first write bit line signal Swbla to a low enough voltage (e.g., the threshold voltage Vth) before the first write word line control signal Swwla of the first write word line WWLa reaches the top voltage level (e.g., the supply voltage). When the voltage level of the first write bit line signal Swbla is lower than the low enough voltage (e.g., the threshold voltage Vth), the logic zero stored in the memory cell that couples to the first write word line WWLa will not be disturbed by the top voltage level of the first write word line control signal Swwla. In other words, the present invention has reduced the half-select-disturb phenomenon in the memory device 300.

In addition, sharing of the transistor Mc by the transistors Mna, . . . , Mnn as the common monitoring transistor has the benefits of saving the chip area of the memory device 300 and lowering the parasitic capacitance of the auxiliary write bit line WLSBSa. It should be noted that, even though the operation of the control circuit 302 is described by writing a value into the first memory cell 102*a* of the first row, the control circuit 302 also has similar benefits when the value is written into the memory cell of the other rows. The detailed description of this process is omitted here for brevity.

Figure 5:
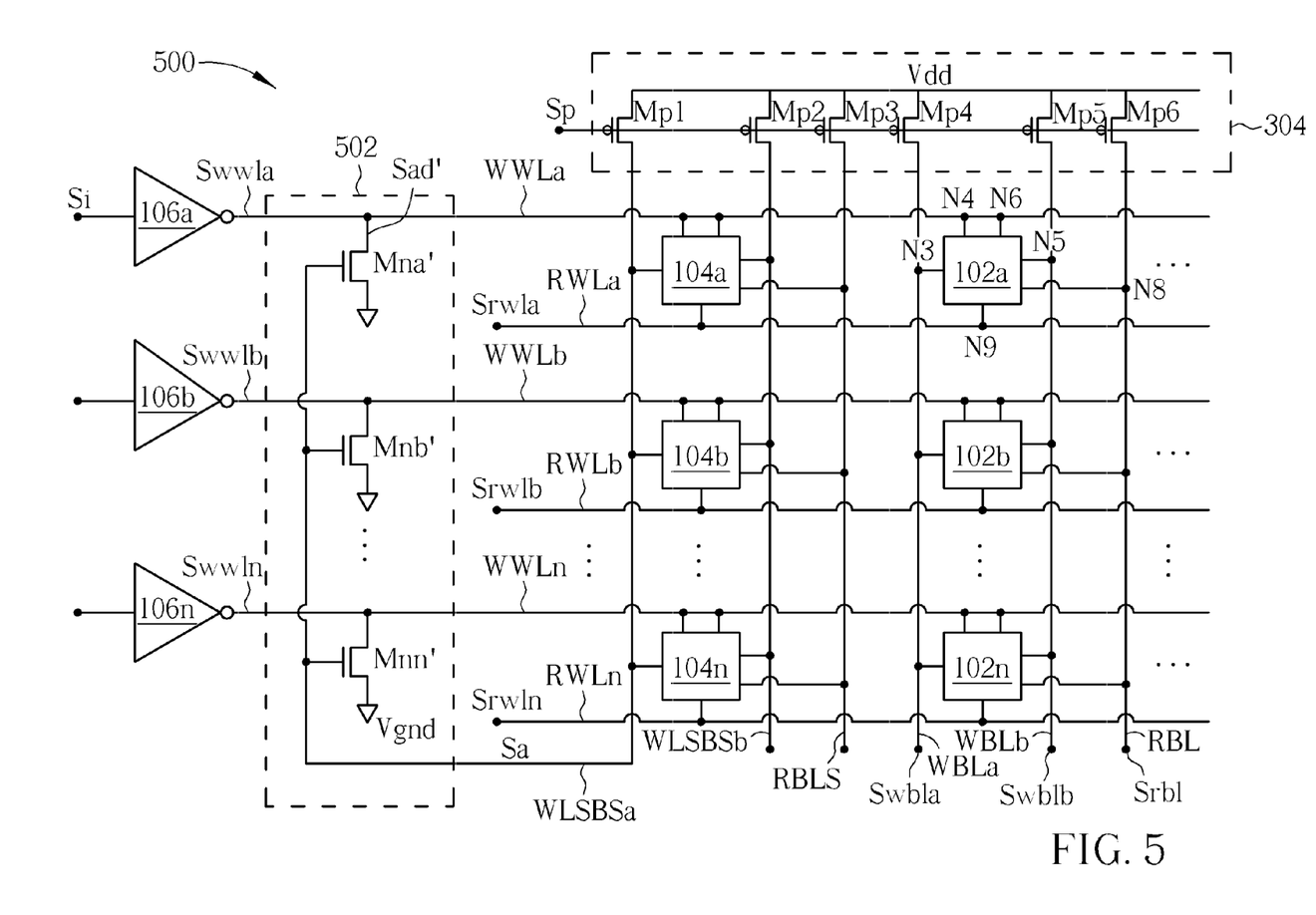
FIG. 5 is a diagram illustrating a memory device according to a third embodiment of the present invention.

Please refer to FIG. 5. FIG. 5 is a diagram illustrating a memory device 500 according to a third embodiment of the present invention. In this embodiment, the detailed circuit of the control circuit is shown. Therefore, for brevity, the components in the memory device 500 are labeled with the same numerals as those in the memory device 300 except for the control circuit. In this embodiment, the control circuit is labeled as 502. The control circuit 502 is a tracking circuit for tracking a variation of the auxiliary bit line voltage Sa of the auxiliary write bit line WLSBSa to generate an adjusting signal Sad' to control the word line voltage of one of the write word lines WWLa, . . . , WWLn. The control circuit 502 may include a plurality of transistors Mna', . . . , Mnn', such as N-type field-effect transistors, wherein each of the transistors Mna', . . . , Mnn' has a control terminal coupled to the auxiliary write bit line WLSBSa, a first connection terminal coupled to the ground voltage Vgnd, and a second connection terminal coupled to each of the write word lines WWLa, . . . , WWLn respectively.

According to the present invention, when the memory device 500 is under the write-in process, one of the write word lines WWLa, . . . , WWLn will be selected. One of the transistors Mna', . . . , Mnn' is used to monitor the variation of the auxiliary bit line voltage Sa of the auxiliary write bit line WLSBSa to generate an adjusting signal Sad' to the selected write word line. To more clearly describe the operation of the control circuit 502, writing a value into the first memory cell 102*a* is taken as an example.

When the memory device 500 enters the write-in process of the first memory cell 102*a*, the first write word line WWLa begins to charge from a low voltage level to a high voltage level. Meanwhile, the first transistor Mna' is turned on since the auxiliary bit line voltage Sa is at the high voltage level. Then, a current flows through the current path consisting of the first transistors Mna', which slows down the rising rate of the first write word line control signal Swwla. In other words, the first write word line control signal Swwla rises gradually with the rising rate slower than the rising rate without the current flowing through the first transistors Mna'. It should be noted that, the pre-charge circuit 304 (e.g., the transistor Mp1) also pre-charges the voltage level of the auxiliary bit line voltage Sa to the high voltage level before the input signal is inputted to the input terminal of one of the inverters 106*a*, . . . , 106*n*. Therefore, when the memory device 500 enters the write-in process of the first memory cell 102*a*, the auxiliary bit line voltage Sa is already at the high voltage level.

Then, the first transistors Mna' will be turned off when the auxiliary bit line voltage Sa decreases to reach the threshold voltage Vth of the first transistors Mna'. When the first transistors Mna' is turned off, the current path is opened, so no more current will flow through the current path to the ground voltage Vgnd. The first write word line control signal Swwla will finally reach the predetermined top voltage level. It should be noted that the predetermined top voltage level can be the supply voltage Vdd or any other voltage level higher or lower than the supply voltage Vdd. When the first write word line control signal Swwla reaches the predetermined top voltage level, the value is controlled to write into the first memory cell 102*a*.

Similar to the description of the second embodiment, since the first auxiliary circuit 104*a* is the dummy circuit of the real memory cells, the falling rate of the auxiliary bit line voltage Sa is substantially equal to the falling rate of the first write bit line signal Swbla of the memory cell storing the logic zero and coupled to the first write word line WWLa. The auxiliary bit line voltage Sa is then utilized by the control circuit 502 for generating the adjusting signal Sad' to adjust the first write word line control signal Swwla of the first write word line WWLa. Therefore, by using the first auxiliary circuit 104*a* and the control circuit 502, the rising rate of the first write word line control signal Swwla is slowed down. In other words, it prolongs the time the first write word line control signal Swwla takes to reach the top voltage level and thus provides enough time for the memory cell storing the logic zero and coupled to the first write word line WWLa to discharge its first write bit line signal Swbla to a low enough voltage (e.g., the threshold voltage Vth) before the first write word line control signal Swwla of the first write word line WWLa reaches the predetermined top voltage level (e.g., the supply voltage). When the voltage level of the first write bit line signal Swbla is lower than the low enough voltage (e.g., the threshold voltage Vth), the logic zero stored in the memory cell that couples to the first write word line WWLa will not be disturbed by the predetermined top voltage level of the first write word line control signal Swwla. In other words, the present invention has reduced the half-select-disturb phenomenon in the memory device 500.

In addition, it should be noted that, even though the operation of the control circuit 502 is described by writing the value into the first memory cell 102*a* of the first row, the control circuit 502 also has similar benefits when the value is written into the memory cell of the other rows. The detailed description of this process is omitted here for brevity.

Figure 6:
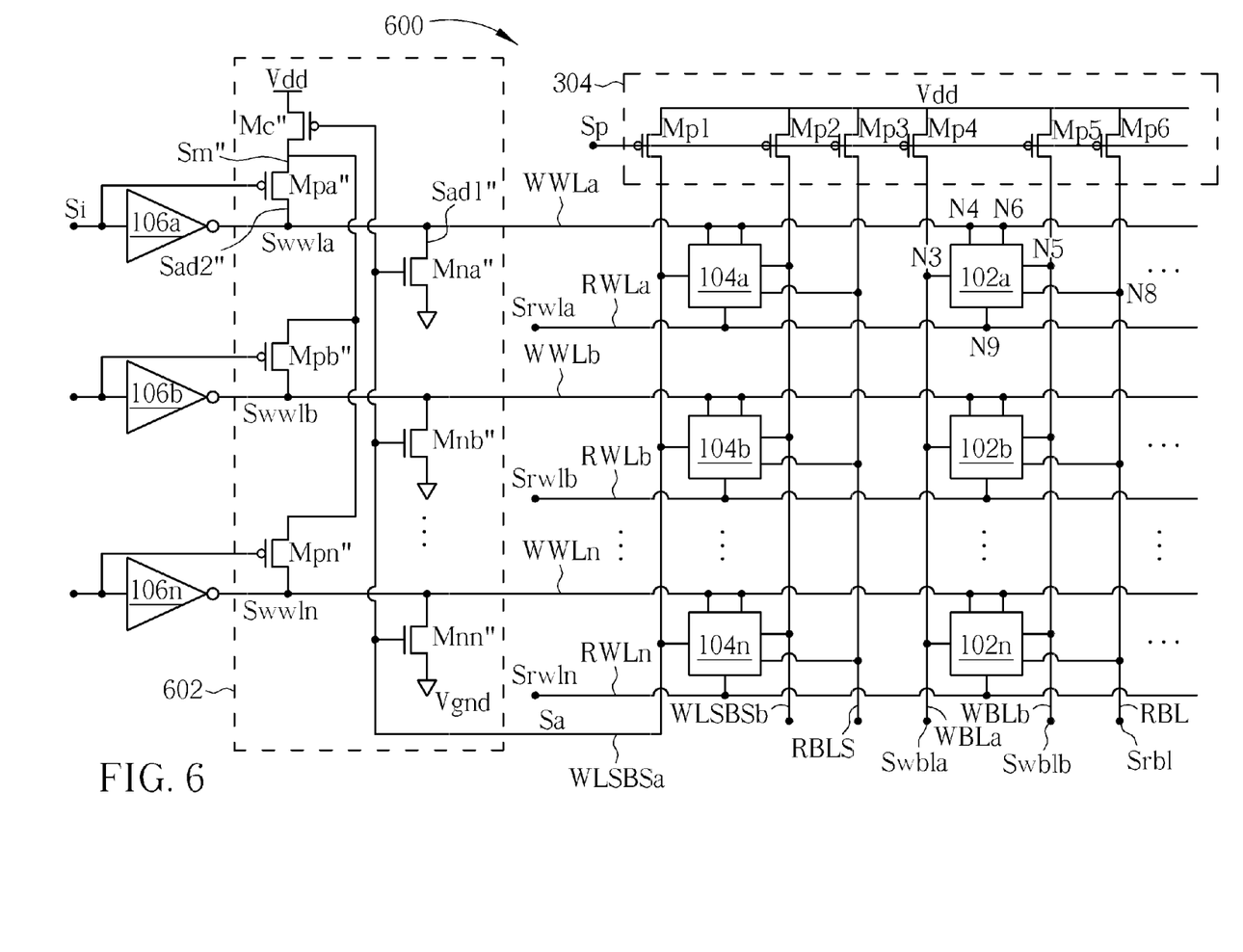
FIG. 6 is a diagram illustrating a memory device according to a fourth embodiment of the present invention.

Please refer to FIG. 6. FIG. 6 is a diagram illustrating a memory device 600 according to a fourth embodiment of the present invention. In this embodiment, the detailed circuit of the control circuit is shown. Therefore, for brevity, the components in the memory device 600 are labeled with the same numerals as those in the memory device 300 except for the control circuit. In this embodiment, the control circuit is labeled as 602. The control circuit 602 is a tracking circuit for tracking a variation of the auxiliary bit line voltage Sa of the auxiliary write bit line WLSBSa to generate an adjusting signal (i.e., Sad1" and Sad2" in FIG. 6) to control the word line voltage of one of the write word lines WWLa, . . . , WWLn. The control circuit 602 may include a plurality of transistors, such as N-type field-effect transistors Mna", . . . , Mnn", a transistor Mc" such as common P-type field-effect transistor, and a plurality of transistors Mpa", . . . , Mpn" such as P-type field-effect transistors. Each of the transistors Mna", . . . , Mnn" has a control terminal coupled to the auxiliary write bit line WLSBSa, a first connection terminal coupled to a voltage such as the ground voltage Vgnd, and a second connection terminal coupled to each of the write word lines WWLa, . . . , WWLn respectively. The common transistor Mc" has a control terminal coupled to the control terminals of the transistors Mna", . . . , Mnn", which are coupled to the auxiliary write bit line WLSBSa, and a first connection terminal coupled to a voltage such as the supply voltage Vdd. Each of the transistors Mpa", . . . , Mpn" has a control terminal respectively coupled to the input terminal of each of the inverters 106a, . . . , 106n, a first connection terminal respectively coupled to the output terminal of each of the inverters 106a, . . . , 106n, which are coupled to the write word lines WWLa, . . . , WWLn respectively, and a second connection terminal coupled to a second connection terminal of the common transistor Mc".

According to the present invention, when the memory device 600 is under the write-in process, one of the write word lines WWLa, . . . , WWLn can be selected. One of the transistors Mna", . . . , Mnn" is used to monitor the variation of the auxiliary bit line voltage Sa of the auxiliary write bit line WLSBSa to generate the first adjusting signal Sad1" to the selected write word line. In addition, in this embodiment, the common transistor Mc" is further used to monitor the variation of the auxiliary bit line voltage Sa of the auxiliary write bit line WLSBSa to generate a monitoring signal Sm" to one of the transistors Mpa", . . . , Mpn" that is coupled to the selected write word line to generate the second adjusting signal Sad2" to the selected write word line. To more clearly describe the operation of the control circuit 602, writing a value into the first memory cell 102a is taken as an example.

When the memory device 600 enters the write-in process of the first memory cell 102a, the first write word line WWLa begins to charge from a low voltage level to a high voltage level. Meanwhile, the first transistor Mna" is turned on and the common transistor Mc" is turned off since the auxiliary bit line voltage Sa is the high voltage level. Then, a first current flows through the current path consisting of the first transistor Mna" to slow down the rising rate of the first write word line control signal Swwla. In other words, the first write word line control signal Swwla rises gradually with the rising rate slower than the rising rate without the current flowing through the first transistor Mna". Meanwhile, the current path consisting of the common transistor Mc" and the first transistor Mpa" is opened. It should be noted that, the pre-charge circuit 304 (e.g., the transistor Mp1) also pre-charges the voltage level of the auxiliary bit line voltage Sa to the high voltage level before the input signal is inputted to the input terminal of one of the inverters 106a, . . . , 106n. Therefore, when the memory device 600 enters the write-in process of the first memory cell 102a, the auxiliary bit line voltage Sa is already at the high voltage level.

The first transistor Mna" will turn off when the auxiliary bit line voltage Sa decreases to reach the threshold voltage Vthn of the first transistor Mna". When the first transistor Mna" is turned off, the current path is opened, therefore no more current will flow through the current path to the ground voltage Vgnd. The common transistor Mc" will turn on when the auxiliary bit line voltage Sa decreases until a voltage difference between the supply voltage Vdd and the auxiliary bit line voltage Sa is larger than the threshold voltage Vthp of the common transistor Mc". When the common transistor Mc" is turned on, a second current path flows from the supply voltage to the first write word line WWLa via the common transistor Mc" and the first transistor Mpa". It should be noted that the turn off time of the first transistor Mna" may or may not overlap the turn on time of the common transistor Mc".

According to the above description, the first transistor Mna" is used to slow down the rising rate of the first write word line control signal Swwla in the early period of the charging of the first write word line WWLa, and the common transistor Mc" and the first transistor Mpa" are used to speed up the rising rate of the first write word line control signal Swwla in the later period of the charging of the first write word line WWLa. In other words, according to this embodiment, the rising rate of the first write word line control signal Swwla is controlled to slow down before the voltage level of the auxiliary bit line voltage Sa is low enough. When the voltage level of the auxiliary bit line voltage Sa is low enough, the rising rate of the first write word line control signal Swwla is controlled to speed up to reach the predetermined top voltage level. It should be noted that the predetermined top voltage level can be the supply voltage Vdd or any other voltage level higher or lower than the supply voltage Vdd. When the first write word line control signal Swwla reaches the predetermined top voltage level, the value is controlled to write into the first memory cell 102a.

Similar to the description of the second embodiment, since the first auxiliary circuit 104a is the dummy circuit of the real memory cells, the voltage variation of the auxiliary bit line voltage Sa is substantially equal to the voltage variation of the first write bit line signal Swbla of the memory cell storing the logic zero and coupled to the first write word line WWLa. The auxiliary bit line voltage Sa is then utilized by the control circuit 602 for generating the first adjusting signal Sad1" to adjust the first write word line control signal Swwla of the first write word line WWLa. Therefore, by using the first auxiliary circuit 104a and the control circuit 602, the rising rate of the first write word line control signal Swwla is slowed down. In other words, it prolongs the time the first write word line control signal Swwla takes to reach the top voltage level and thus provides enough time for the memory cell storing the logic zero and coupled to the first write word line WWLa to discharge its first write bit line signal Swbla to a low enough voltage (e.g., the threshold voltage Vth) before the first write word line control signal Swwla of the first write word line WWLa reaches the predetermined top voltage level (e.g., the supply voltage). Then, when the voltage level of its first write bit line signal Swbla is low enough (e.g., lower than the threshold voltage Vth), the logic zero stored in the memory cell that couples to the first write word line WWLa will not be disturbed by the predetermined top voltage level of the first write word line control signal Swwla. After that, the rising rate of the first write word line control signal Swwla is sped up to reach the predetermined top voltage level by the controlling of the second adjusting signal Sad2".

Accordingly, the logic zero stored in the memory cell that couples to the first write word line WWLa will not be disturbed by the predetermined top voltage level of the first write word line control signal Swwla. In other words, the present invention has reduced the half-select-disturb phenomenon in the memory device 600.

In addition, sharing of the transistor Mc" by the transistors Mpa", . . . , Mpn" as the common monitoring transistor has the benefits of saving the chip area of the memory device 600 and lowering the parasitic capacitance of the auxiliary write bit line WLSBSa. It should be noted that, even though the operation of the control circuit 602 is described by writing the value into the first memory cell 102a of the first row, the control circuit 602 also has similar benefits when the digital value is written into the memory cell of the other rows. The detailed description of this process is omitted here for brevity.

Figure 7:
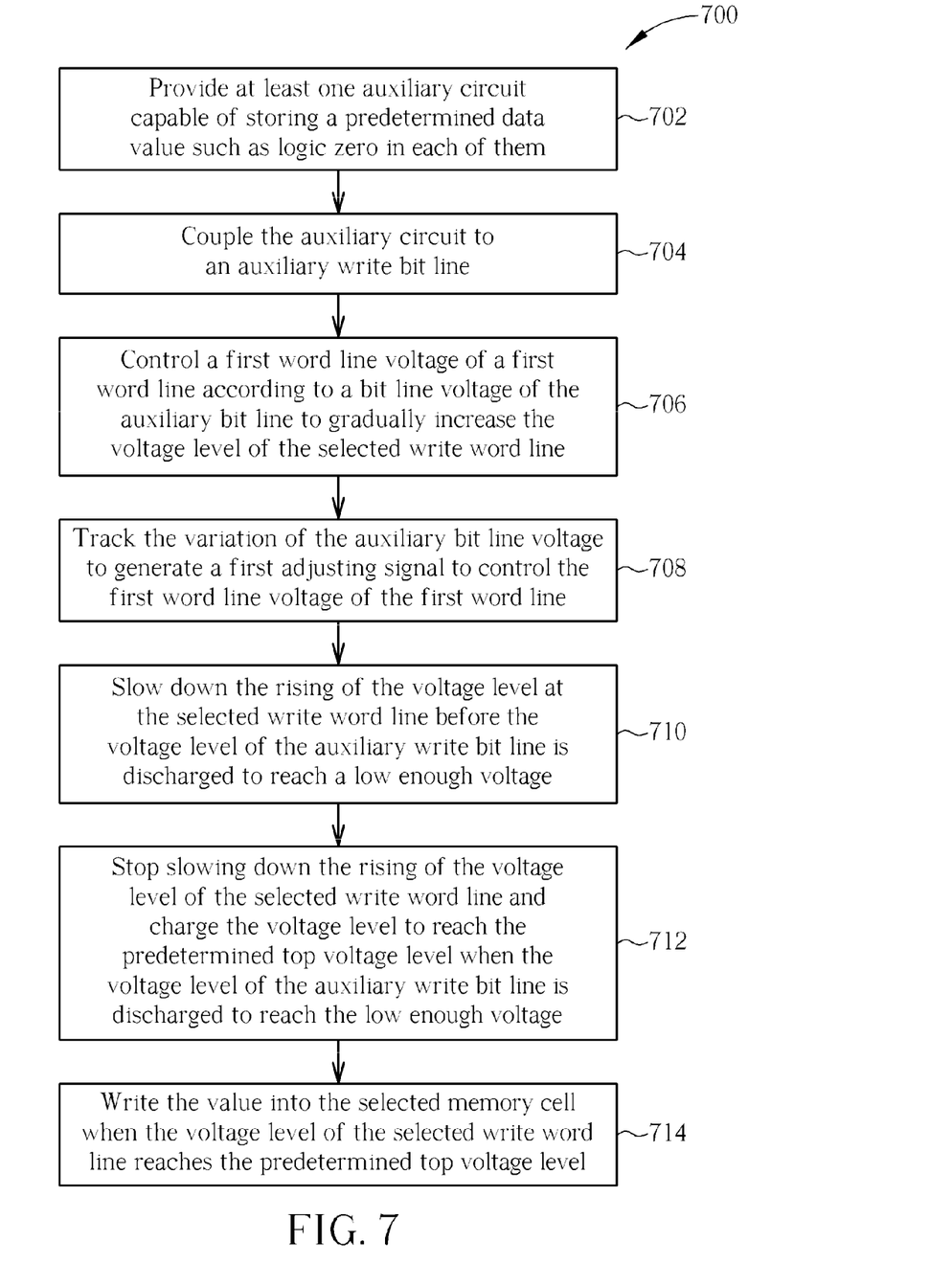
FIG. 7 is a flowchart illustrating a method of controlling a memory device according to a fifth embodiment of the present invention.

The operation of the above embodiments can be summarized in the steps shown in FIG. 7. FIG. 7 is a flowchart illustrating a method 700 of controlling a memory device according to a fifth embodiment of the present invention, wherein the memory device can refer to any one of the above mentioned memory devices. For brevity, the method 700 is described in conjunction with the embodiment of memory device 100. Provided that substantially the same result is achieved, the steps of the flowchart shown in FIG. 7 need not be in the exact order shown and need not be contiguous; that is, other steps can be intermediate. Besides, some of the steps shown in FIG. 7 can be omitted according to different embodiments or design requirements. The method 700 comprises the steps:

Step 702: Provide at least one auxiliary circuit 104a capable of storing a predetermined data value such as logic zero in each of them, wherein the auxiliary circuit 104a is controlled by a first word line WWLa;

Step 704: Couple the auxiliary circuit 104a to an auxiliary write bit line WLSBSa;

Step 706: Control a first word line voltage of the first word line WWLa according to a bit line voltage Sa of the auxiliary bit line WLSBSa to gradually increase the voltage level of the selected write word line WWLa;

Step 708: Track the variation of the auxiliary bit line voltage Sa of the auxiliary write bit line WLSBSa to generate a first adjusting signal to control the first word line voltage of the first word line WWLa;

Step 710: Slow down the rising of the voltage level at the selected write word line WWLa before the voltage level of the auxiliary write bit line WLSBSa is discharged to reach a low enough voltage;

Step 712: Stop slowing down the rising of the voltage level of the selected write word line WWLa and charge the voltage level to reach the predetermined top voltage level when the voltage level of the auxiliary write bit line WLSBSa is discharged to reach the low enough voltage;

Step 714: Write the value into the selected memory cell 102a when the voltage level of the selected write word line WWLa reaches the predetermined top voltage level.

According to the above disclosed embodiments, by storing logic zero into the plurality of auxiliary circuits 104a, . . . , 104n, the control circuit 108 can dynamically track the voltage level of the auxiliary write bit line WLSBSa to determine if the voltage level is discharged to reach a low enough voltage or not. Before the voltage level of the auxiliary write bit line WLSBSa is discharged to reach the low enough voltage, the control circuit 108 can slow down the rising of the voltage level at the selected write word line, and when the voltage level of the auxiliary write bit line WLSBSa is discharged to reach the low enough voltage, the control circuit 108 can stop the slowing down of the rising of the voltage level at the selected write word line and charges the voltage level to reach the predetermined top voltage level. Therefore, by slowing down the rising of the voltage level at the selected write word line before the voltage level of the auxiliary write bit line WLSBSa reaches the low enough voltage, the logic zero stored in the memory cells that are coupled to the selected write word line can be guaranteed to not change into logic one when the voltage level of the selected write word line reaches the predetermined top voltage level. Therefore, the present invention has reduced the half-select-disturb phenomenon in the memory such as static random access memory.

Those skilled in the art will readily observe that numerous modifications and alterations of the device and method may be made while retaining the teachings of the invention.

What is claimed is:

1. A memory device, comprising:
   a first memory cell, at least controlled by a first word line;
   a first auxiliary circuit, coupled to an auxiliary bit line and controlled by the first word line, the first auxiliary circuit capable of storing a predetermined data value; and
   a control circuit, capable of controlling a first word line voltage of the first word line according to a bit line voltage of the auxiliary bit line.

2. The memory device of claim 1, wherein the bit line voltage derives from the predetermined data value stored in the first auxiliary circuit.

3. The memory device of claim 1, wherein the first word line is a write word line.

4. The memory device of claim 1, wherein the predetermined data value is zero.

5. The memory device of claim 1, wherein the control circuit comprises:
   a tracking circuit, capable of tracking a variation of the bit line voltage of the auxiliary bit line to generate a first adjusting signal to control the first word line voltage of the first word line.

6. The memory device of claim 5, wherein the tracking circuit comprises:
   a first transistor, having a control terminal coupled to the auxiliary bit line, a first connection terminal coupled to the first word line to output the first adjusting signal, and a second connection terminal coupled to a first supply voltage.

7. The memory device of claim 6, wherein the first transistor is an N-type field-effect transistor.

8. The memory device of claim 6, wherein the tracking circuit further comprises:
   a second transistor, having a control terminal and a first connection terminal both coupled to the first word line to output the first adjusting signal, and a second connection terminal coupled to the first connection terminal of the first transistor.

9. The memory device of claim 8, wherein the first transistor and the second transistor are N-type field-effect transistors.

10. The memory device of claim 6, further comprising:
    an inverter, having an input terminal receiving an input signal, and an output terminal coupled to the first word line for generating the first word line voltage according to the input signal;
    wherein the tracking circuit further comprises:
    a second transistor, having a control terminal coupled to the control terminal of the first transistor, and a first connection terminal coupled to a second supply voltage; and a third transistor, having a control terminal coupled to the input terminal of the inverter, a first connection terminal coupled to the output terminal of the inverter to output the first adjusting signal, and a second connection terminal coupled to a second connection terminal of the second transistor.

11. The memory device of claim 10, wherein the first transistor is an N-type field-effect transistor, and the second transistor and the third transistor are both P-type field-effect transistors.

12. The memory device of claim 5, further comprising:
a second memory cell, at least controlled by a second word line; and
a second auxiliary circuit, coupled to the auxiliary bit line and controlled by the second word line, the second auxiliary circuit capable of storing the predetermined data value;
wherein the tracking circuit is further capable of tracking the variation of the bit line voltage of the auxiliary bit line to generate a second adjusting signal to control the second word line voltage of the second word line.

13. The memory device of claim 12, wherein the tracking circuit comprises:
a first transistor, having a control terminal coupled to the auxiliary bit line, a first connection terminal, and a second connection terminal coupled to a first supply voltage;
a second transistor, having a control terminal and a first connection terminal both coupled to the first word line to output the first adjusting signal, and a second connection terminal coupled to the first connection terminal of the first transistor; and
a third transistor, having a control terminal and a first connection terminal both coupled to the second word line to output the second adjusting signal, and a second connection terminal coupled to the first connection terminal of the first transistor.

14. The memory device of claim 13, wherein the first transistor, the second transistor, and the third transistor are N-type field-effect transistors.

15. The memory device of claim 12, wherein the tracking circuit comprises:
a first transistor, having a control terminal coupled to the auxiliary bit line, a first connection terminal coupled to the first word line to output the first adjusting signal, and a second connection terminal coupled to a first supply voltage;
a second transistor, having a control terminal coupled to the auxiliary bit line, a first connection terminal coupled to the second word line to output the second adjusting signal, and a second connection terminal coupled to the first supply voltage;
a first inverter, having an input terminal receiving a first input signal, and an output terminal coupled to the first word line for generating the first word line voltage according to the first input signal;
a second inverter, having an input terminal receiving a second input signal, and an output terminal coupled to the second word line for generating the second word line voltage according to the second input signal;
a third transistor, having a control terminal coupled to the control terminals of the first and the second transistors, and a first connection terminal coupled to a second supply voltage;
a fourth transistor, having a control terminal coupled to the input terminal of the first inverter, a first connection terminal coupled to the output terminal of the first inverter to output the first adjusting signal, and a second connection terminal coupled to a second connection terminal of the third transistor; and
a fifth transistor, having a control terminal coupled to the input terminal of the second inverter, a first connection terminal coupled to the output terminal of the second inverter to output the second adjusting signal, and a second connection terminal coupled to the second connection terminal of the third transistor.

16. The memory device of claim 15, wherein the first and second transistors are N-type field-effect transistors, and the third, the fourth, and the fifth transistors are P-type field-effect transistors.

17. A method of controlling a memory device, wherein the memory device comprises a first memory cell at least controlled by a first word line, the method comprises:
providing a first auxiliary circuit capable of storing a predetermined data value, wherein the first auxiliary circuit is controlled by the first word line;
coupling the first auxiliary circuit to an auxiliary bit line; and
controlling a first word line voltage of the first word line according to a bit line voltage of the auxiliary bit line.

18. The method of claim 17, wherein the bit line voltage derives from the predetermined data value stored in the first auxiliary circuit.

19. The method of claim 17, wherein the step of controlling the first word line voltage of the first word line according to the bit line voltage of the auxiliary bit line comprises:
tracking a variation of the bit line voltage of the auxiliary bit line to generate a first adjusting signal to control the first word line voltage of the first word line.

20. The method of claim 19, wherein the memory device further comprises a second memory cell at least controlled by a second word line, the method further comprises:
providing a second auxiliary circuit capable of storing the predetermined data value, wherein the second auxiliary circuit is controlled by the second word line;
coupling the second auxiliary circuit to the auxiliary bit line; and
tracking the variation of the bit line voltage of the auxiliary bit line to generate a second adjusting signal to control the second word line voltage of the second word line, wherein the bit line voltage derives from the predetermined data value stored in the second auxiliary circuit.

* * * * *